(12) United States Patent
Pichler

(10) Patent No.: US 7,122,398 B1
(45) Date of Patent: Oct. 17, 2006

(54) MANUFACTURING OF OPTOELECTRONIC DEVICES

(75) Inventor: Karl Pichler, Santa Clara, CA (US)

(73) Assignee: Nanosolar, Inc., Palo Alto, CA (US)

( * ) Notice: Subject to any disclaimer, the term of this patent is extended or adjusted under 35 U.S.C. 154(b) by 75 days.

(21) Appl. No.: 10/810,072

(22) Filed: Mar. 25, 2004

(51) Int. Cl.
*H01L 21/00* (2006.01)
*H01L 31/042* (2006.01)

(52) U.S. Cl. .......................... 438/66; 438/22; 438/80; 257/E31.058; 136/244

(58) Field of Classification Search ............... None
See application file for complete search history.

(56) References Cited

U.S. PATENT DOCUMENTS

| | | | |
|---|---|---|---|
| 4,754,544 A * | 7/1988 | Hanak | 438/66 |
| 5,131,954 A * | 7/1992 | Vogeli et al. | 136/244 |
| 5,639,314 A * | 6/1997 | Kura et al. | 136/244 |
| 6,057,506 A * | 5/2000 | Charache et al. | 136/253 |
| 2001/0043629 A1 | 11/2001 | Sun et al. | 372/43 |
| 2003/0032209 A1* | 2/2003 | Yeh et al. | 438/22 |
| 2003/0077847 A1* | 4/2003 | Yoo | 438/22 |
| 2003/0092210 A1* | 5/2003 | Koide | 438/22 |
| 2003/0143771 A1* | 7/2003 | Kidoguchi et al. | 438/46 |
| 2003/0153108 A1* | 8/2003 | Durocher et al. | 438/26 |
| 2003/0189215 A1* | 10/2003 | Lee et al. | 257/94 |
| 2003/0209714 A1* | 11/2003 | Taskar et al. | 257/79 |
| 2004/0032220 A1* | 2/2004 | Cok et al. | 315/291 |
| 2004/0097101 A1* | 5/2004 | Kwong et al. | 438/781 |
| 2005/0088079 A1* | 4/2005 | Daniels | 313/504 |
| 2005/0158902 A1* | 7/2005 | Chua et al. | 438/32 |

OTHER PUBLICATIONS

"Global Solar Process" slides, 9, 10, 11, 23, 24, presented at 29th IEEE PVSC, Polycrystalline Thin-Film Solar Cells—Manufacturing Technology, Part 2, May 18-25, 2002, New Orleans, LA.
A. Duggal et al., "OLEDs for Lighting: New Approaches" in *Organic Light-Emitting Materials and Devices VII*, edited by Sakya H. Katafi, Paul A. Lane, Proceedings of SPIE vol. 5214 pp. 241-247 (SPIE, Bellingham, WA, Feb. 2004).

(Continued)

*Primary Examiner*—Luan Thai

(57) ABSTRACT

A method for manufacturing optoelectronic devices is disclosed. A layered structure may be formed with a plurality of layers including a bottom electrode layer, a top electrode layer, and one or more active layers between the top and bottom electrode layers. The layered structure is divided into one or more separate device module sections by cutting through one or more of the layers of the layered structure. At least one of the layers is an unpatterned layer at the time of cutting. Each of the resulting device module sections generally includes a portion of the active layer disposed between portions of the top and bottom electrode layers. An edge of a device section may optionally be protected against undesired electrical contact between two or more of the bottom electrode, top electrode and active layer portions. Two or more device module sections may be assembled into a device and connected in series by electrically connecting the bottom electrode layer portion of one device section to the top electrode layer portion of another device module section.

20 Claims, 6 Drawing Sheets

OTHER PUBLICATIONS

Miasole Solution from http://www.miasole.com/solution/asp, 2003.
U.S. Appl. No. 10/403,997 entitled "Improved Transparent Electrode, Optoelectronic Apparatus and Devices", filed Mar. 29, 2003.
U.S. Appl. No. 10/443,456 entitled "Photovoltaic Devices Fabricated by Growth From Porous Template", filed May 21, 2004.
U.S. Appl. No. 10/782,545 entitled "High Throughput Surface Treatment on Coiled Flexible Substrates", filed Feb. 19, 2004.
U.S. Appl. No. 10/782,017 entitled "Solution-Based Fabrication of Photovoltaic Cell", filed Feb. 19, 2004.

* cited by examiner

MANUFACTURING OF OPTOELECTRONIC DEVICES

FIELD OF THE INVENTION

This invention is related to manufacturing of optoelectronic devices and specifically to methods for roll-to-roll manufacturing of optoelectronic device modules on flexible foil substrates.

BACKGROUND OF THE INVENTION

Optoelectronic devices interact with radiation and electric current. The interaction can be photoelectric where the device converts incident radiant energy (e.g., in the form of photons) into electrical energy. Optoelectronic devices often tend to be high voltage and low current devices. Currently many optoelectronic devices, e.g., thin-film photovoltaic (PV) cells and organic light-emitting diodes (OLEDs) are made by depositing patterns of material on a substrate to form the various device layers, e.g., a bottom electrode, an active layer stack and a top electrode (plus auxiliary layers), of individual devices. For example, in the case of PV cells, typically all the bottom and top electrodes as well as the active PV layer stack are patterned to create individual PV cells that are later series-wired. The patterning is typically done via laser or mechanical scribing, or photolithographic patterning. This patterning adds extra processing steps and often introduces complications that can reduce the yield of useful devices. For example, laser patterning or mechanical scribing may result in a condition known as overscribing where the scribing cuts too deeply into one or more layers. Similarly, such scribing techniques may result in underscribing where the scribing does not cut sufficiently deep into one or more layers. Furthermore, many scribing techniques can generate debris that may be inadvertently and undesirably incorporated into the finished devices. All of these effects may interfere with proper device performance or cause catastrophic failure of devices and thereby add to the overall cost of useful devices.

Furthermore, certain conventional thin-film PV cells, e.g. Mo/CIGS/CdS/TCO or TCO/CdS/CdTe/top metal or stainless steel/insulator/metal/a-Si PV stack/top TCO, require patterning steps and may also need insulators on metal foil substrates. Techniques for singulation into individual cells, e.g., laser scribing, often can not be used on such cells because of the associated risk of also cutting the underlying bottom electrode (e.g. Mo).

Thus, there is a need in the art, for a method for manufacturing optoelectronic devices that overcomes the above disadvantages.

BRIEF DESCRIPTION OF THE DRAWINGS

The teachings of the present invention can be readily understood by considering the following detailed description in conjunction with the accompanying drawings, in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Optoelectronic devices may be manufactured less expensively and by cutting an unpatterned (or substantially unpatterned) layered structure into individual sections. According to embodiments of the present invention, an optoelectronic device may be manufactured in a roll-to-roll fashion with at least one but preferably more if not all of the individual layers that would normally be patterned being not patterned. Instead, a layered structure is formed, e.g., by one or more thin-film layer depositions. The layered structure is cut entirely into individual separated sections, e.g., stripes (preferably in a lengthwise direction) and then assembled into a module (e.g. by lamination), together with back-to-front series wiring.

Figure 1A:
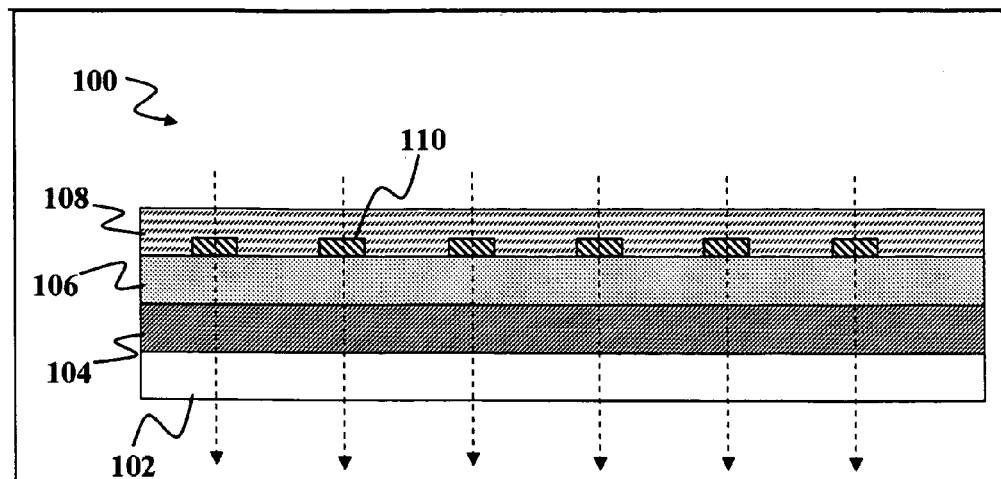
FIGS. 1A–1B are cross-sectional schematic diagrams illustrating manufacture of optoelectronic devices according to an embodiment of the present invention.

For example, FIG. 1A illustrate cross-sections depicting optoelectronic devices at different stages of fabrication according to embodiments of the present invention. In FIG. 1A, a layered structure 100 may be formed with, among other layers, a substrate 102, a bottom electrode layer 104 (102 and 104 could optionally be combined into one), one or more active layers 106, and a top electrode layer 108. Generally speaking, it is desirable that at least one, and possibly both, of the bottom and top electrodes 104, 108 are light-transmitting, e.g., transparent or at least translucent to radiation over some wavelength range of interest. It is also desirable to fabricate the structure using layer formation techniques that are compatible with roll-to-roll processing with the substrate 102 being a long continuous sheet that passes through one or more layer formation stages in sequence as the other layers are formed on top of it.

Figure 1B:
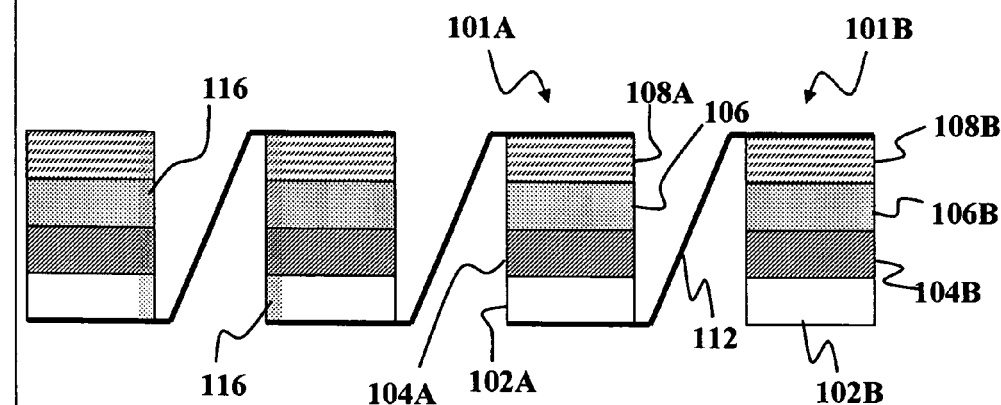

To fabricate a plurality of series-connected optoelectronic device modules from the layered structure 100, one or more of the layers of the layered structure 100 may be cut through as indicated by the arrows to divide the layered structure into one or more separate device sections 101A, 101B, each having substrate layer portions 102A, 102B, bottom electrode layer portions 104A, 104B, active layer portions 106A, 106B and top electrode layer portions 108A, 108B as shown in FIG. 1B. At least one of the layers 104, 106 or 108 is an unpatterned layer at the time of cutting. In a preferred embodiment, all or nearly all of the layers of layered structure 100 are wherein at least one of the layers is an unpatterned layer at the time of cutting. The layered structure 100 may be cut lengthwise (i.e., along the web direction in a roll-to-roll processing context) into strips by any suitable means, e.g., conventional mechanical cutting such as with a knife, blade, scissors or cutting wheel, cutting by water jet, abrasive particle jet, or laser cutting with a suitable laser such as an excimer/UV, IR (e.g., $CO_2$, solid-state, etc.) laser. Additional optional layers, not shown here, may be present in the device 100; such layers may be oxygen and/or moisture barrier layers, light input/output coupling layers, generally surface passivating layers, etc.

The cutting process may compress (smear, melt or partially melt, cause particulates, etc.) the layers of the layered structure together causing undesirable contact between non-adjacent layers, e.g., the top and bottom electrode layers 104, 106. It is important to guard against such contact, which could reduce the yield of useful devices. One possible way to protect against undesired inter-layer contact during cutting would be to place strips of, e.g., electrically insulating, short-proofing material 110, e.g., oxide, nitride, polymer, etc. between the top electrode layer 108 and the active layers 106 at the locations where the layered structure 100 is to be cut. The strips of short-proofing material 110 protect against undesired contact as the layered structure 100 is cut. The short-proofing layer material 110 could be deposited onto the layered structure 100 at various steps before and/or during and/or after the roll-to-roll manufacturing e.g. by printing techniques (ink-jet, screen, flexographic, etc.), co-extrusion, laminating, inserting tape or adhesive tape, and the like. The short proofing material 110 could be liquid (e.g., polymers or monomers), or paste, composite, that is, e.g., thermally and/or UV-cured or dried. Alternatively, the short-proofing materials could be adhesive insulating tapes or could be pressure or heat-sensitive (e.g. meltable/reflowable/bondable thermoplastics) laminated tapes without adhesive. In addition, the short proofing material 110 could also be made from patterned inorganic insulators deposited by e.g. evaporation, sputtering, CVD, etc. techniques with or without additional patterning steps such as lithography. The short proofing material could be placed between one or more layers, e.g. between layers 106 and 108 (as shown) and/or between 104 and 106.

Another possible way to protect against undesired inter-layer contact is, after cutting, to passivate the now exposed sides of the device modules to form a passivated layer 114 that inhibits undesired inter-layer electrical contact. For example, the sides of the device modules may be passivated by thermal oxidation, exposure to passivating chemicals, activated oxygen (from e.g. a plasma or UV-ozone), oxidizing precursor chemicals, etc. (gas, liquid, etc.), coating the sides (e.g. by laminating, taping, printing, extruding, techniques) with a passivating substance (e.g. UV/thermally curable polymer/liquid). Generally, the passivating material/process is one that renders conductive or semi-conductive potentially shorting materials/debris from the cutting step into a form that is less conductive or substantially insulating such that cutting-induced shorting is reduced or eliminated. Such an optional passivating layer 116 (e.g. a printed or laminated layer) could also assist to prevent cell electrical shorting during the back-to-front series wiring process, and layer 116 may also be used in combination with short proofing layer(s) 110.

Each device section has a portion of the active layer 106A, 106B, disposed between portions of the top electrode layer 108A, 108B and bottom electrode layer 104A, 104B. The individual device sections 101A, 101B may be electrically connected in series, e.g., by electrically connecting the bottom electrode layer portion 104A of one device section 101A to the top electrode layer portion 108B of another device section 101B with electrically conducting pathways 112, e.g., metal tapes, wires, meshes, grids, printed conductive inks and the like. The conducting pathways 112 may typically be bonded to the top electrode portion 108B and bottom electrode portion 104A by, e.g., conductive adhesives, soldering, laser-welding, and the like.

Two or more of the device sections 101A, 101B may be assembled into a module, e.g., by laminating them between layers of encapsulant materials. Examples of suitable encapsulant materials include one or more layers of polymers, such as polyethylene terephthalate (PET), ethylene vinyl acetate (EVA), and/or Mylar®. Mylar is a registered trademark of E.I. du Pont de Nemours and Company of Wilmington, Del. Inorganic materials, such as glass and plastic foils, metalized plastic foils, and metal foils may also be used for the encapsulant layer. The encapsulant layer may also include nitrides, oxides, oxynitrides or other inorganic materials. Alternatively, the encapsulants may include Tefzel® (DuPont), tefdel, thermoplastics, polyimides, polyamides, Aclam/Aclar (trade names of products marketed by Honeywell, Inc.), nanolaminate composites of plastics and glasses (e.g. barrier films), and combinations of the above. For example, a thin layer of (expensive) EVA/polyimide laminated to thick layer of (much less expensive) PET.

The substrate 102 may be any suitable material, e.g., plastic, metal, glass, ceramic, etc. It is desirable to fabricate the device using a flexible material as the substrate 102. By way of example, the substrate 102 may be a plastic foil such as PET, Mylar, PEN, polyimide, PES or the like. The bottom electrode layer 104 may be a coating of metal, such as molybdenum, deposited on an upper surface of the substrate 102, e.g., by sputtering. The substrate 102 may be pre-coated with the bottom electrode layer 104, e.g., in the case of a metalized plastic foil or indium tin oxide (ITO) coated glass. Alternatively, the substrate 102 may be made from an electrically conducting foil, such as stainless steel, Al, Mo, etc. Where the substrate 102 is electrically conductive, the substrate 102 may serve as the bottom electrode layer 104 and a separate bottom electrode layer is optional. Note that this also applies to the discussion of the embodiments that follow.

In an alternative embodiment, a conductive or insulating substrate 102 may be coated with an optional insulating smoothing layer that substantially covers all or most of the surface roughness of substrate 102, followed by the deposition of a conductive bottom electrode 104. Said smoothing layer could e.g. be a solution-processed precursor material that converts into an oxide (e.g. a spin-on-glass type material), an organic material, an organic polymeric material or a sputtered or CVD-processed oxide, nitride or oxy-nitride.

In another embodiment, a conductive or insulating substrate 102 may be coated with an optional conductive smoothing layer (for example a conductive polymer), which may act as electrode 104 or said conductive smoothing layer may be followed by the actual electrode 104.

In yet another embodiment, a conductive substrate 102 (e.g. a metal foils such as a stainless steel or Al foil) may be followed by a partial insulating smoothing layer. This smoothing layer is partial in that said smoothing layer, via its wetting properties and/or thickness, leaves a fraction of the tops of the (rougher) conductive substrate 102 exposed such that a subsequently deposited electrode 104 makes electrical contact through the partially covering smoothing layer through to the conductive substrate 102. In this embodiment, the thickness requirements for the electrode layer 104 are reduced as low resistivity is substantially provided through the conductive substrate 102.

Figure 1C:
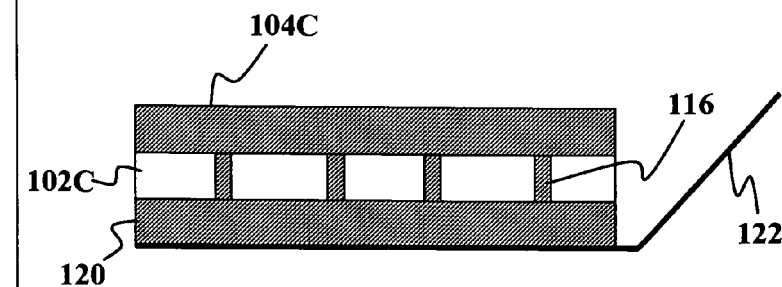
FIG. 1C is a cross-sectional schematic diagram of a portion of an optoelectronic device illustrating a scheme for making electrical contact with a bottom electrode disposed on an insulating substrate according to an embodiment of the present invention.

In cases where the substrate 102 is made from an insulating material, e.g., PET or polyimideand the like, it is often desirable to make electrical contact to the bottom electrode layer, e.g., for series wiring. In such a case, such desirable electrical contact may be facilitated as shown in FIG. 1C. A bottom electrode layer 104C may be formed on one side of a substrate 102C having a plurality of vias 116 formed therethrough, e.g., by laser drilling, lithographic etching, or other techniques and filled with electrically conductive material, e.g., a metal such as molybdenum, aluminum, copper and the like. The vias 116 may be formed and/or filled either before or after the bottom electrode layer 104C. An electrically conducting bus bar or contact layer 120 may then be formed on an opposite of the substrate 102C such that the substrate 102C is disposed between the contact layer 120 and the bottom electrode 104C. The contact layer 120 and bottom electrode 104 make electrical contact through the conductive material filling the vias 116. An electrical contact 122 may then provide series connection to an adjacent photovoltaic device (not shown) as described above.

The active layers 106 may include two or more layers with each layer having different charge-transfer properties than an adjacent layer. In the case of photovoltaic devices, the active layers 106 may include one or more light-absorbing materials. The active layers 106 may include organic or inorganic semiconducting materials. Examples of suitable active layer materials are described in commonly assigned U.S. patent application Ser. No. 10/782,017, published as US Patent Application Publication 20050183767A1 entitled "SOLUTION-BASED FABRICATION OF PHOTOVOLTAIC CELL", the entire disclosures of which are incorporated herein by reference, and in commonly assigned U.S. patent application Ser. No. 10/443,456, now U.S. Pat. No. 6,946,597 entitled "PHOTOVOLTAIC DEVICES FABRICATED BY GROWTH FROM POROUS TEMPLATE", the entire disclosures of which are incorporated herein by reference, and in commonly assigned U.S. patent application Ser. No. 60/390, 904 entitled "NANO-ARCHITECTED/ASSEMBLED SOLAR ELECTRICITY CELL", the entire disclosures of which are incorporated herein by reference. Further, the active layers 106 may be used as a component or components in an organic light emitting diode, electrochromic window, or other optoelectronic device.

Organic materials may be deposited by suitable wet coating techniques, e.g., spin-, dip-, spray-, or roll-to-roll coating, printing techniques such as screen- flexo-graphic, gravure, micro-gravure, and the like. Furthermore, organic materials may be deposited by Meyer-bar coating, blade coating, self-assembly or electrostatic self-assembly techniques. Wet coating techniques may be preceded by modification of the underlying surface with a plasma, UV-ozone, surface agent, surfactant, adhesion-promoter or other treatment to assure good uniform thickness of the coating and/or uniform wetting of the structure with a uniform thickness film of the organic material, e.g., by creating a high surface energy, highly wetting surface. In addition, organic material coatings may be prepared by non-solution based techniques, such as evaporation or sublimation of molecules thermal evaporation or, more preferably, organic vapor phase deposition.

Examples of suitable inorganic materials include, e.g., metal oxides such as titania ($TiO_2$), zinc oxide (ZnO), copper oxide (CuO or $Cu_2O$ or $Cu_xO_y$), zirconium oxide, lanthanum oxide, niobium oxide, tin oxide, vanadium oxide, molybdenum oxide, tungsten oxide, strontium oxide, calcium/titanium oxide and other oxides, sodium titanate, potassium niobate, cadmium selenide (CdSe), cadmium suflide (CdS), copper sulfide (e.g., $Cu_2S$), cadmium telluride (CdTe), cadmium-tellurium selenide (CdTeSe), copper-indium diselenide ($CuInSe_2$, CIS), copper-indium gallium diselenide ($CuInGaSe_2$, CIGS), cadmium oxide ($CdO_x$), silicon, amorphous silicon, III/V semiconductors, II/VI semiconductors, CIGS, as well as blends or alloys of two or more such materials. These materials may optionally be highly or lightly doped with n- or p-type dopants. Specific examples include layer structures such as (a) CdS, (b) CIGS, or CdS and (c) CdTe, or similar inorganic PV layer structures generally known in the prior art. Inorganic semiconductor coatings may be deposited by plating, electroplating, electro-deposition, sol, sol-gel, CVD, PECVD, metal organic CVD (MOCVD), sputtering, evaporation, close-space-sublimation, ALD, deposition/coating with precursor-inks and the like.

After the bottom electrode is coated with the active layer(s) 106 additional processing steps may be necessary, e.g., annealing, reduction, conversion, surface treatments, selenization, doping, curing, anodization, sol-gel processing, polymer fill, re-crystallization, grain-boundary passivation, and any other process steps that may be required for a given thin film optoelectronic device.

By way of example, and without limitation, if the optoelectronic device is to be a photovoltaic device, the active layers 106 may include material of the general formula $CuIn_{1-x}Ga_x(S \text{ or } Se)_2$. Such a layer may be fabricated on the bottom electrode 104 by co-sputtering, or by depositing a nanoparticle-based ink, paste or slurry, e.g., in a film roughly 4 to 5 microns thick when wet. Examples of such nanoparticle-based inks are described e.g., in US Patent Application Publication number 20050183767A1, which has been incorporated herein by reference. The film may be annealed by heating to a temperature sufficient to burn off any binders or cap layers on the particles and sinter the particles together. The resulting layer may be about 1 micron to about 2 microns thick after annealing. After annealing, the film may optionally be exposed to selenium vapor at about 300–500° C. for about 30–45 minutes to ensure the proper stoichiometry of Se in the film. To carry out such a Se vapor exposure, the film, if deposited on a flexible substrate, can be wound into a coil and the coil can be coated so that the entire roll is exposed at the same time, substantially increasing the scaleability of the Se vapor exposure process. Examples of processing a coiled substrate are described e.g., in U.S. patent application Ser. No. 10/782,545, titled "HIGH THROUGHOUT SURFACE TREATMENT ON COILED FLEXIBLE SUBSTRATES", and published as US Patent Application Publication 20050186338, which is incorporated herein by reference.

The active layers 106 may further include a window layer to smooth out the "slope" between the bandgaps of the different materials making up the $CuIn_{1-x}Ga_x(S \text{ or } Se)_2$ layer. By way of example, the bandgap adjustment layer may include cadmium sulfide (CdS), zinc sulfide (ZnS), or zinc selenide (ZnSe) or some combination of two or more of these. Layers of these materials may be deposited, e.g., by chemical bath deposition, to a thickness of about 50 nm to about 100 nm.

Alternatively, the optoelectronic device may be a light emitting device, such as an OLED. Examples of OLED's include light-emitting polymer (LEP) based devices. In such a case, the active layer(s) 106 may be For example, the active layer(s) 106 may include a layer of poly (3,4) ethyl-endioxythiophene:polystyrene sulfonate (PEDOT:PSS), which may be deposited to a thickness of typically between 50 and 200 nm on the bottom electrode 104, e.g., by web coating or the like, and baked to remove water. PEDOT:PSS is available from Bayer Corporation of Leverkusen, Germany. A polyfluorene based LEP may then be deposited on the PEDOT:PSS layer (e.g., by web coating) to a thickness of about 60–70 nm. Suitable polyfluorene-based LEPs are available from Dow Chemicals Company.

The top electrode layer 108 is often (though not invariably) transparent, or at least translucent. Examples of suitable transparent conducting materials for the top electrode layer 108 include transparent conductive oxides (TCO's) such as indium-tin-oxide, (ITO), or tin oxide, (with or without fluorine doping), zinc oxide, Al-doped zinc oxide, and the like. Such TCO layers may be combined with metallic grids of additional lower resistance materials, such as e.g. screen-printed metal-particle pastes (e.g. silver-paste). In addition, the top electrode layer 108 may include a conductive polymer such as conductive polythiophene, conductive polyaniline, conductive polypyrroles, PSS-doped PEDOT (e.g. Baytron™), a derivative of PEDOT, a derivative of polyaniline, a derivative of polypyrrole. In addition, conductive polymers may be combined with metallic grids or wire arrays and/or a TCO to provide a transparent conductive electrode. Examples of such conductive electrodes are described, e.g., in U.S. patent application Ser. No. 10/403,997, now U.S. Pat. No. 6,936,761, entitled "IMPROVED TRANSPARENT ELECTRODE, OPTO-ELECTRONIC APPARATUS AND DEVICES", the disclosures of which are incorporated herein by reference.

Figure 2A:
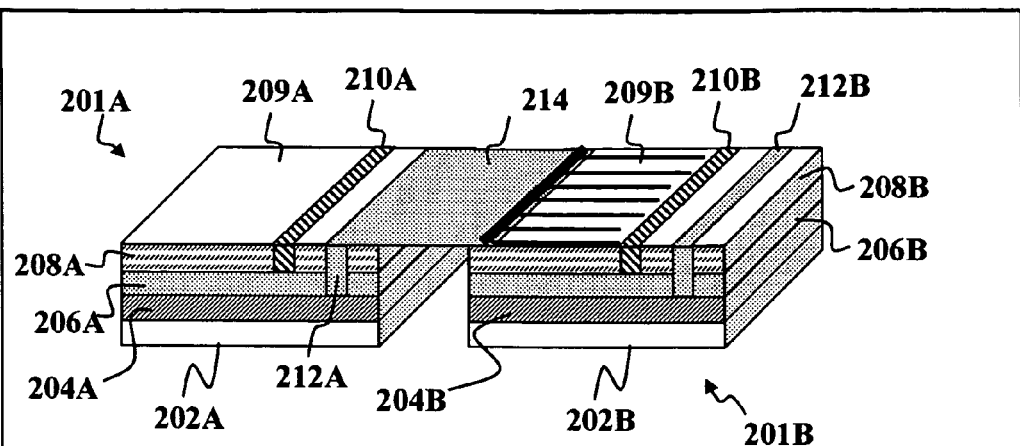
FIGS. 2A–2D are three-dimensional schematic diagrams illustrating an alternative scheme for series connecting optoelectronic devices according to an embodiment of the present invention.

In addition to the steps described above, embodiments of the present invention may include other optional steps. For example, one or more layers and/or patterns of low-resistance bus-bars may be formed adjacent to the top electrode layer 108 or bottom electrode layer 104 before and/or after the cutting the layered structure. Said low-resistance bus bars, could, for example, be a printed comb-like structure with a thicker base line running along the direction of the cut-up or to-be cut-up stripes with perpendicular finer 'fingers of the comb' running perpendicular as shown in FIG. 2A. Such bus bars may be, e.g., formed screen printed conductive inks, metal/alloy layers deposited (e.g. evaporated) through a shadow mask or deposited (e.g., by evaporation, plating, electro-plating, electro-less plaiting, sputtering, CVD, and the like). In addition, the bus-bars may be formed by subsequent patterning (e.g. lithography), or could be laminated metal tapes, wires, meshes. The back-to-front series wiring between individual devices may be connected to the bus-bars (e.g. via conductive adhesives, soldering, and the like).

Figure 2B:
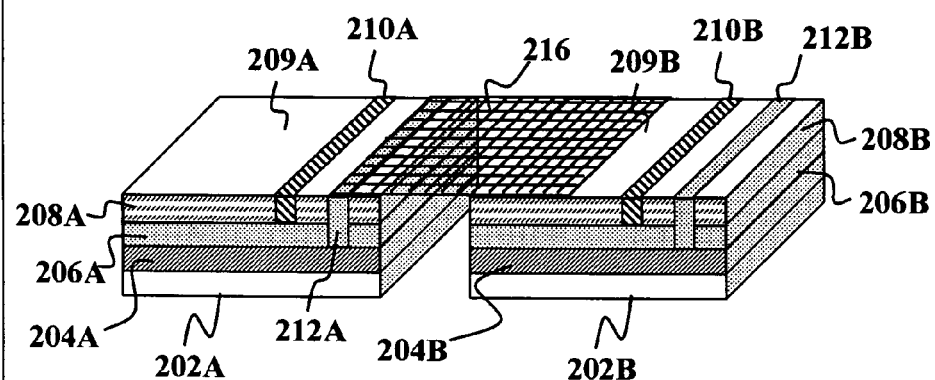

There are several possible schemes to series connect optoelectronic device modules together. For example, as depicted in FIGS. 2A–2B, device module sections 201A, 201B include optional substrate layer portions 202A, 202B, bottom electrode layer portions 204A, 204B, active layer portions 206A, 206B and top electrode portions 208A, 208B. Trenches filled with electrically conductive material 212A, 212B are formed through the top electrode layer portions 208A, 208B and active layer portions 206A, 206B to make electrical contact with the bottom electrode layer portions 202A, 202B. Trenches could be left open/bare, be passivated or alternatively be filled with electrically insulating materials 210A, 210B electrically isolate major areas 209A, 209B of the top electrode layer portions 208A, 208B from the conductive material 212A, 212B.

Note that electrically insulating material 210A, 210B and/or the electrically conductive material 212A, 212B could be applied before, during or after cutting the layered structure, or partially before and/or partially after. The trenches may be filled with the electrically conductive material 212A, 212B may be an electrically conductive ink deposited, e.g., by printing (e.g., screen printing, flexographic printing, microgravure printing and the like) or a metal deposited by evaporation or sputtering or by melting, soldering, welding or bonding the series interconnect wire/mesh into the trench down to the bottom electrode. The electrically conductive material 212A, 212B may also be a printed (e.g. ink-jet, screen, flexo, etc.) conductive polymer (Pedot, Pani, polypyrole, etc.).

An electrically conductive tape 214 (as shown in FIG. 2A) or mesh 216 (as shown in FIG. 2B) may then make electrical contact between the conductive material 212A of one device module section 201A and the major area 209B of the top electrode 208B of an adjacent device module section 201B.

Figure 2C:
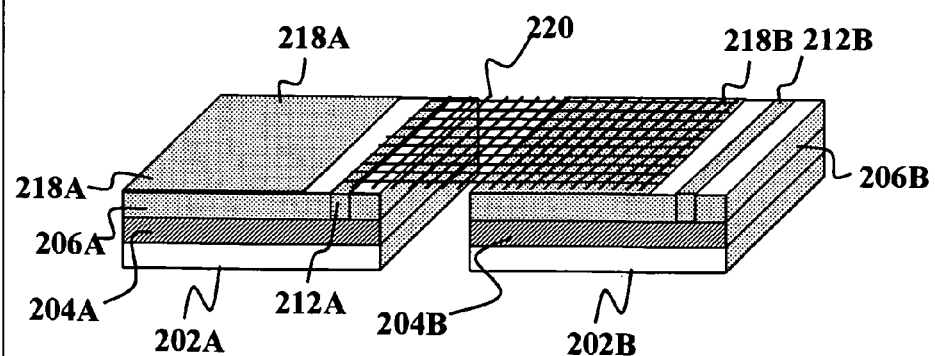

In a variation on the series connection scheme of FIGS. 2A–2B, the function of the top electrode layer portions of the modules 201A, 201B may be combined with the series interconnection. For example, as show in FIG. 2C, transparent conductive layers 218A, 218B, e.g., conductive polymers, may be disposed such that they partially cover the active layers 206A, 206B. Trenches filled with conductive material 212A, 212B may be formed in exposed portions of the active layers 206A, 206B that are not covered by the transparent conductive layers 218A, 218B. A conductive metal mesh 216 may electrically contact the conductive material 212A on one device module section 201A and substantially cover the transparent conductive layer 218B on another module 201B. The conductive layer 218A, 218B and metal mesh 216 may be deposited after the cutting step but could also be partially pre-deposited before the cutting step (e.g. over area 209A, 209B) with an additional metal mesh, foil, tape or wire that connects said mesh with adjacent 212A, 212B, etc. The combination of the metal mesh 216 and transparent conductive layers 218A, 218B can provide highly conductive (i.e., low sheet resistance) transparent top electrode portions as well as acting as back-to-front series interconnects.

Figure 2D:
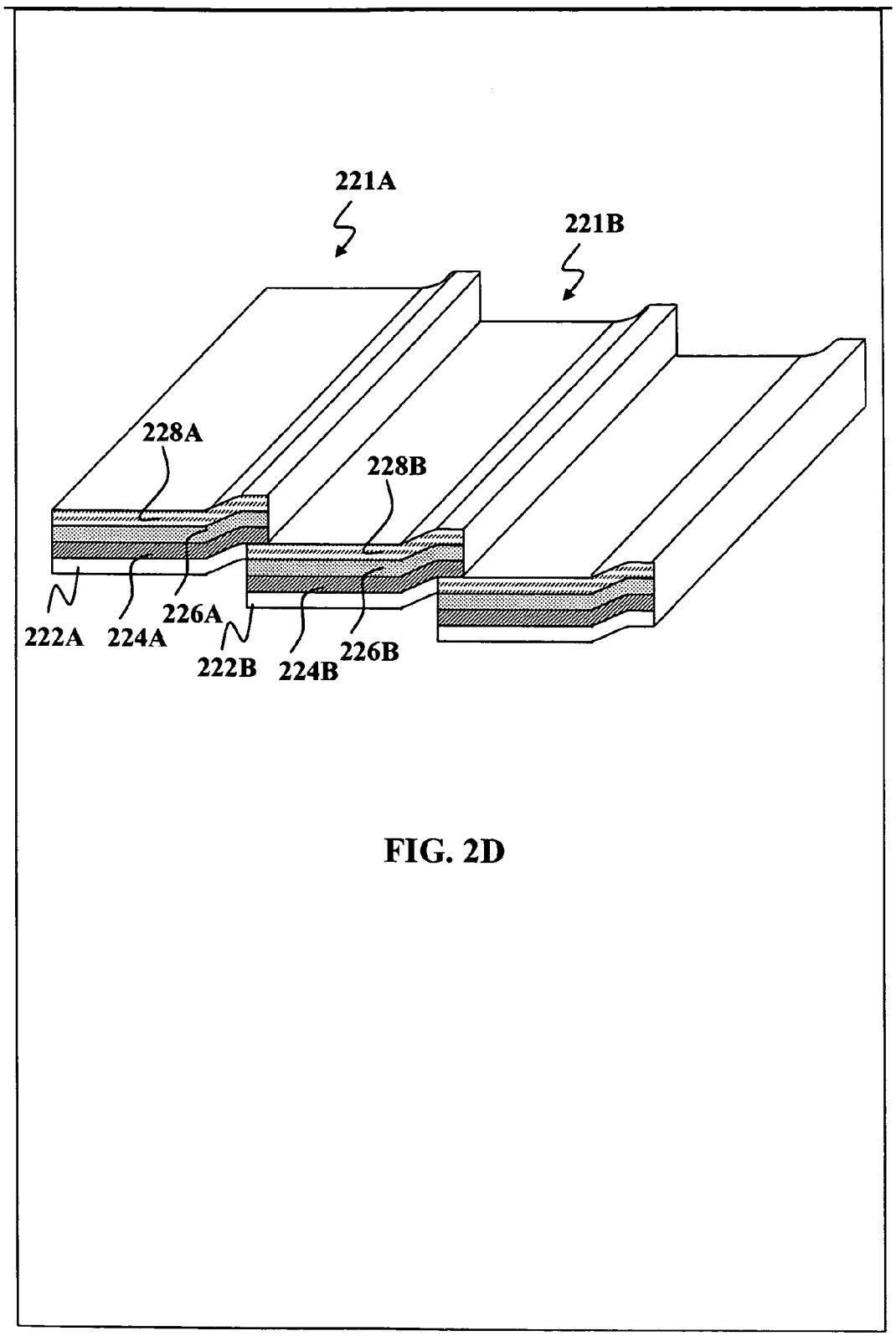

The back-to-front series wiring could also be done by overlapping a part of the bottom electrode (or substrate) of one device module with a part of the top electrode of an adjacent device module. An example of this is depicted in FIG. 2D. Here, for example, device modules 221A, 221B each have substrate layers 222A, 222B, bottom electrode layers 224A, 224B, active layers 226A, 226B and top electrode layers 228A, 228B. A portion of the substrates 222A, 222B have been removed so that the bottom electrode layer 222A of one device module 221A may contact the top electrode layer 228B of an adjacent device module 221B. Note that if the substrate 222A is electrically conducting, it may make contact with the top electrode layer 228B.

Figure 3A:
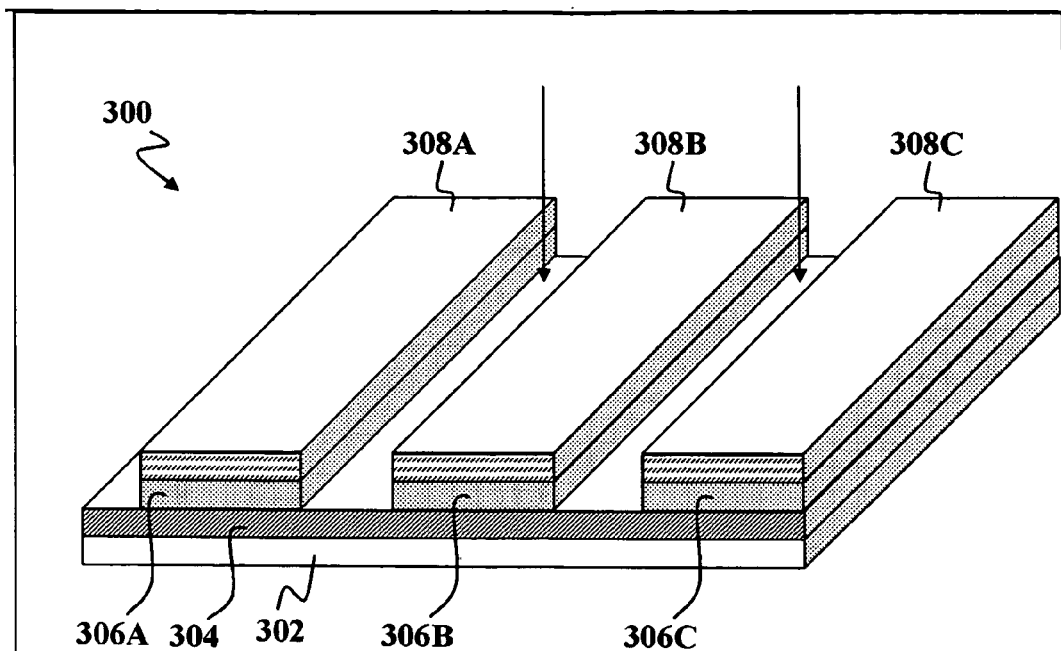
FIGS. 3A–3B are three-dimensional schematic diagrams illustrating an alternative scheme for dividing a layered structure into separate optoelectronic device sections and series connecting the optoelectronic devices according to an embodiment of the present invention.
Figure 3B:
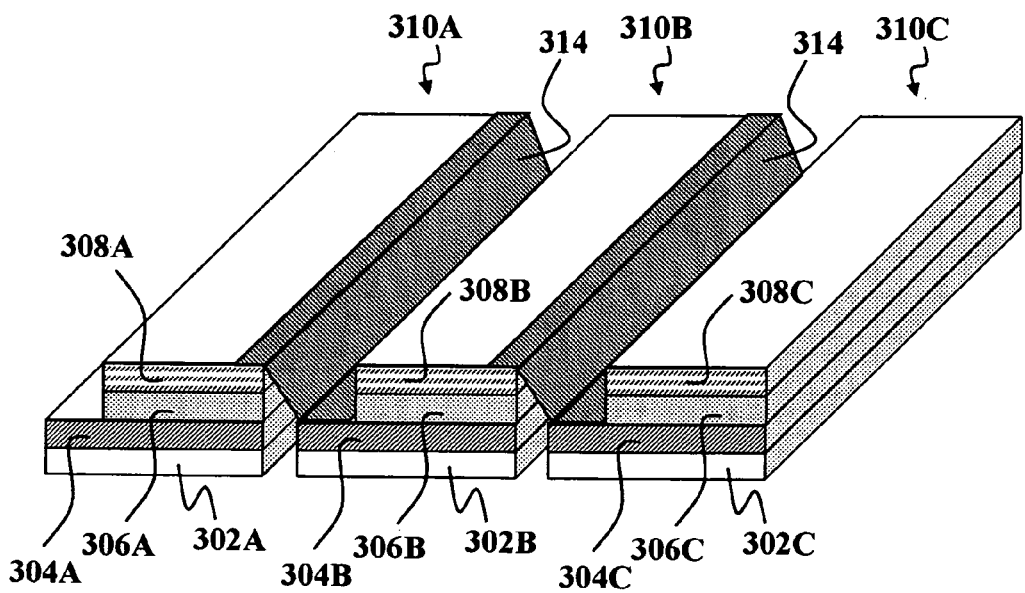

In some embodiments of the invention some of the layers in the layered structure may be patterned layers. For example, FIGS. 3A–3B illustrate fabrication of an optoelectronic device with patterned layers. As shown in FIG. 3A, a layered structure 300 may include an unpatterned substrate 302 with an unpatterned bottom electrode layer 304. Patterned active layer portions 306A, 306B, 306C may be may be formed on the electrode layer 304. Patterned top electrode layer portions 308A, 308B, 308C may be formed over the patterned active layer portions 306A, 306B, 306C. The layered structure 300 may then be cut as indicated by the arrows in FIG. 3A to divide it into device modules 310A, 310B, 310C as shown in FIG. 3B.

The active layer portions 306A, 306B, 306C may be formed, e.g., by printing an ink (e.g. ink-based CIGS or CdTe cells), by printing a polymer or polymer/molecule blend or organic/inorganic blend (e.g. in organic bulk-heterojunction PV cells or in a hybrid organic/inorganic-type cells (polymer plus inorganic semiconductor particles, rods, tripods), or by printing a sol-gel. The printing may be followed by any necessary treatment steps, e.g. anneal, reduction of oxides, selenization, calcination, drying, recrystallization, and the like. The active layer portions 306A, 306B, 306C may be printed or deposited in a patterned manner (e.g. screen, flexo, etc.) or they may be deposited over the bottom electrode layer as a single unpatterned active layer which is subsequently post-patterned, e.g., by selectively removing portions of the unpatterned layer. Alternatively, the active layer portions 306A, 306B, 306C may be deposited over or in-between a laminated/printed spacer (e.g. spacer tape) that is subsequently removed. The spacer may be removed before any annealing step or after but is generally done after the deposited film is dried sufficiently so it does not re-flow detrimentally. Individual active PV layers, fillers, etc. may have different patterning steps. The top electrode portions 308A, 308B, 308C may be deposited on the active layer portions 306A, 306B, 306C, e.g. via mask. Alternatively, a taped mask may be placed over selected portions of the bottom electrode layer 304 and/or the active layer portions 306A, 306B, 306C. The top electrode portions may then be deposited all over with post-patterning via removal of the taped mask. Alternatively, laser scribing or lithographic patterning could be used.

Note that although FIG. 3A depicts a layer structure having an unpatterned bottom electrode layer 304, it is also possible for the bottom electrode layer to be patterned before the cutting step. For example strips of laminated tape or adhesive tape may be laid down as a mask on the substrate 302 as a mask. A layer of conductive material, e.g. Mo or TCO may then be sputtered over the substrate and mask. The mask may then be peeled off leaving gaps between strips of conductive material. If the substrate 302 is made of an electrically insulating material, the gaps provide electrical separation of individual bottom electrode layer portions.

As shown in FIGS. 3A–3B the active layer portions 306A, 306B and top electrode portions 308A, 308B, 308C may be patterned in such a way as to leave of the bottom electrode portions 304A, 304B, 304C exposed after the cutting step. In such a case the bottom a simple conductor 314 such as a foil or mesh may connect electrode portion 304A of one device module 310A to the top electrode portion 308B of an adjacent module 310B. Note that the cuts in FIGS. 3A and 3B do not have to be plane with the edge of the 306 and 308 layers on one side. Alternatively, the cuts could be placed in between such as to leave exposed sections of 304 left on both sides of the stripes 306/308. The same alternative placement could be carried out for the arrangement FIG. 4.

Figure 4:
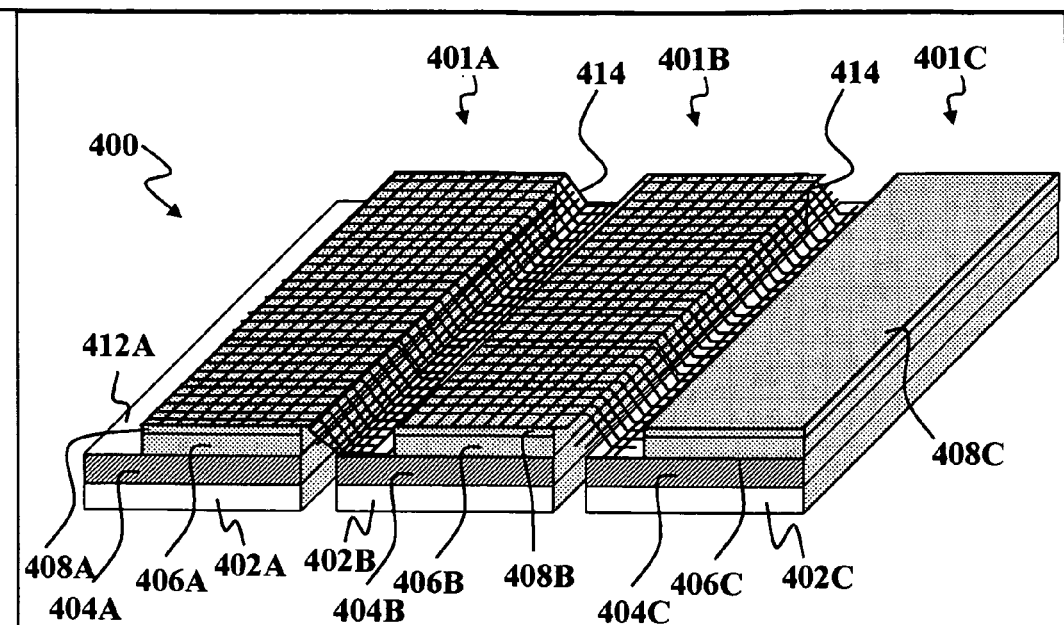
FIGS. 4 is a three-dimensional schematic diagram illustrating another alternative scheme for dividing a layered structure into separate optoelectronic device sections and series connecting the optoelectronic devices according to an embodiment of the present invention.

FIG. 4 depicts a variation on the embodiment illustrated in FIGS. 3A–3B. Here an optoelectronic device 400 has been manufactured by cutting a layered structure into device modules 401A, 401B, 401C. The device modules include substrate portions 402A, 402B, 402C, bottom electrode portions 404A, 404A, 404C and active layer portions 406A, 406A, 406C. Transparent conductive layers 408A, 408B, 408C and conductive mesh 414 act as transparent top electrode portions. The conductive mesh 414 also provides series electrical contact between, e.g., and exposed upper portion of bottom electrode 402B and transparent conductive layer 408A in a manner similar to that described above with respect FIG. 3B. The mesh 414 and conductive layers 408A, 408B provide highly conductive and transparent top electrode portions as described above with respect to FIG. 2C.

Figure 5A:
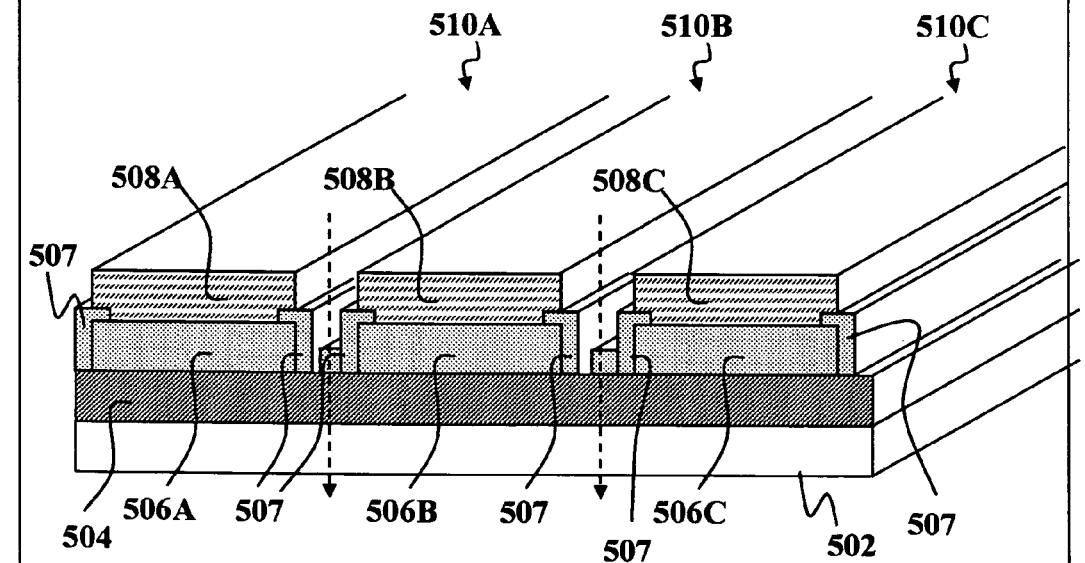
FIGS. 5A–5B are three-dimensional schematic diagrams illustrating another alternative scheme for dividing a layered structure into separate optoelectronic device sections according to an embodiment of the present invention.

Other alternative embodiments may combine various different inventive features described above. For example, it is possible to combine pre-patterning selected layers of a layered structure with protecting the edges during cutting. As shown in FIG. 5A, a layered structure 500 may include an unpatterned substrate 502 and unpatterned bottom electrode layer 504. Patterned active layer portions 506A, 506B, 506C may be formed on the bottom electrode layer 504, e.g., as described above with respect to FIG. 3A. Protective insulating stripes 507 may then be printed, laminated or otherwise stuck over the exposed edges of the active layer portions 506A, 506B, 506C. Note that all these drawings are not to scale and the layers are very thin, e.g., a few microns maximum typically with the printed/laminated insulating stripes 507 perhaps in the range of several 10s to several 100s of microns at maximum. Then top electrode layer portions 508A, 508B, 508C may be formed on the active layer portions 506A, 506B, 506C in a patterned manner, e.g., as described above with respect to FIG. 3A. Then the layered structure 500 may be cut as indicated by the arrows to form individual device module sections 510A, 510B, 510C, which may then be wired in series back-to-front series, e.g., as described above. After the cutting step the edge of the substrate 502 and/or bottom electrode 504 may be protected with e.g. tape, printed insulator etc. to prevent shorts during back-to-front series wiring. Note that the material 507 right at the cutting line may not be required. Alternatively, the material 507 could be present just at the edges of 506/508

Figure 5B:
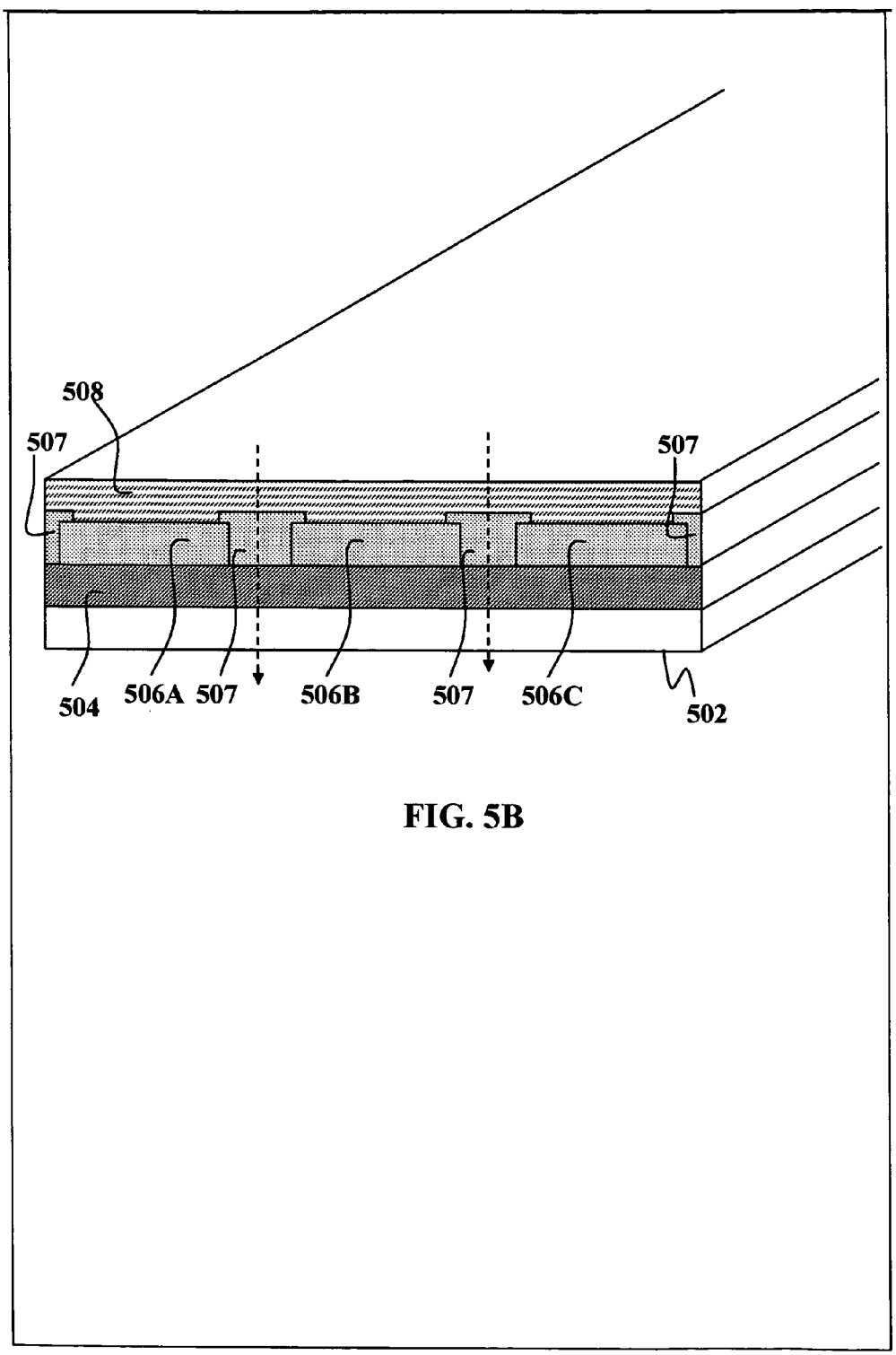

FIG. 5B illustrates a variation on the embodiment depicted in FIG. 5A. In this embodiment, a layered structure 501 may include unpatterned substrate 502, unpatterned bottom electrode 504. Patterned active layer portions 506A, 506B, 506C may be formed on the bottom electrode portion 504, e.g., as described above with respect to FIG. 3A. Protective insulating stripes 507 may then be printed, laminated or otherwise stuck between the exposed edges of the active layer portions 506A, 506B, 506C. Note that all these drawings are not to scale and the layers are very thin, e.g., a few microns maximum typically with the printed/laminated insulating stripes 507 perhaps in the range of several 10s to several 100s of microns at maximum. Then an unpatterned top electrode layer 508 may be formed over the active layer portions 506A, 506B, 506C and the insulating stripes 507. Then the layered structure 501 may be cut at the locations of the insulating stripes 507 as indicated by the arrows to form individual device module sections, which may then be wired in series back-to-front series, e.g., as described above.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. The appended claims are not to be interpreted as including means-plus-function limitations, unless such a limitation is explicitly recited in a given claim using the phrase "means for."

What is claimed is:

1. A method for manufacturing photovoltaic devices, comprising the steps of:
    forming a layered photovoltaic device structure having a plurality of layers including a bottom electrode layer, a top electrode layer, and one or more active layers between the top and bottom electrode layers;

cutting through one or more of the layers of the layered structure to divide the layered structure into one or more separate device sections, each section having a portion of the active layer disposed between portions of the top and bottom electrode layers, wherein at least one of the layers is an unpatterned layer at the time of cutting;

providing at least one form of protection that protects against undesired inter-layer contact during cutting;

assembling two or more device sections into a module; and electrically connecting the bottom electrode layer portion of one device section to the top electrode layer portion of another device section.

2. The method of claim 1 wherein cutting through one or more of the layers of the layered structure includes cutting through a substrate layer of the layered structure.

3. The method of claim 1 wherein cutting through one or more of the layers of the layered structure includes cutting through all of the layers of the layered structure.

4. The method of claim 1 wherein all of the layers of the layered structure are unpatterned layers at the time of cutting.

5. The method of claim 1, further comprising protecting an edge of a device section against undesired electrical contact between two or more of the bottom electrode, top electrode and active layer portions.

6. The method of claim 5 wherein protecting an edge of a device section includes the step of, before cutting through one or more of the layers of the layered structure, placing short-proofing material between adjacent layers of the layered structure proximate a location where the layered structure is to be cut.

7. The method of claim 5, wherein protecting an edge of a device section includes the step of passivating a side of the device section.

8. The method of claim 7 wherein passivating a side of the device section includes the step of oxidizing the side, exposing the side to passivating chemicals, or coating the side with a passivating substance.

9. The method of claim 1 wherein assembling two or more device sections into a module includes the step of laminating the two or more device sections side-by-side between layers of laminating material.

10. The method of claim 1, further comprising the step of, before cutting through one or more of the layers of the layered structure to divide the layered structure into one or more device sections, patterning the top electrode layer and/or active layers to define the one or more device module sections.

11. The method of claim 10, further comprising protecting an edge of a device section against undesired electrical contact between two or more of the bottom electrode, top electrode and active layer portions of the one or more device module sections.

12. The method of claim 11, wherein protecting an edge of a device section includes the steps of:

after patterning the top electrode layer and/or active layers, disposing an insulating material between the active layer portions of two or more adjacent device sections.

13. The method of claim 1 wherein forming a layered structure includes covering the active layer and the insulating material with an unpatterned top electrode layer before cutting the layered structure to divide the layered structure into one or more device sections.

14. The method of claim 12 wherein cutting the layered structure includes cutting the layered structure at locations corresponding to the insulating material.

15. The method of claim 1 wherein electrically connecting the bottom electrode layer portion of one device section to the top electrode layer portion of another device section includes the steps of:

exposing a portion of an upper surface of the bottom electrode layer portion of a first device section; and
connecting an electrically conductive material between the top electrode layer portion of a second device section and the exposed portion of the upper surface of the bottom electrode layer.

16. The method of claim 1 wherein providing at least one form of protection that prevents shorts which could arise from the cutting steps includes, before cutting through the layered structure, placing strips of electrically insulating, short-proofing material between the top electrode layer and the one or more active layers at the locations where the layered structure is to be cut, whereby the strips of short-proofing material protect against undesired contact as the layered structure is cut.

17. A method for manufacturing photovoltaic devices, the method comprising:

forming a layered photovoltaic device structure having a plurality of layers including a bottom electrode layer, a top electrode layer, and one or more active layers between the top and bottom electrode layers;

cutting through one or more of the layers of the layered structure to divide the layered structure into one or more separate device sections, each section having a portion of the active layer disposed between portions of the top and bottom electrode layers, wherein at least one of the layers is an unpatterned layer at the time of cutting;

providing at least one form of protection that prevents shorts which could arise from the cutting steps;

assembling two or more device sections into a module; and electrically connecting the bottom electrode layer portion of one device section to the top electrode layer portion of another device section;

wherein providing at least one form of protection that prevents shorts which could arise from the cutting steps includes, before cutting through the layered structure, placing strips of electrically insulating, short-proofing material between the top electrode layer and the one or more active layers at the locations where the layered structure is to be cut, whereby the strips of short-proofing material protect against undesired contact as the layered structure is cut.

18. The method of claim 17 wherein cutting through one or more of the layers of the layered structure includes cutting through a substrate layer of the layered structure.

19. The method of claim 17 wherein all of the layers of the layered structure are unpatterned layers at the time of cutting.

20. The method of claim 17, further comprising protecting an edge of a device section against undesired electrical contact between two or more of the bottom electrode, top electrode and active layer portions.

* * * * *